(12) United States Patent
Martin et al.

(10) Patent No.: US 12,381,532 B2
(45) Date of Patent: Aug. 5, 2025

(54) BULK ACOUSTIC WAVE DEVICE WITH INTEGRATED TEMPERATURE SENSOR AND HEATER

(71) Applicant: TEXAS INSTRUMENTS INCORPORATED, Dallas, TX (US)

(72) Inventors: Keegan Shaun Martin, Dallas, TX (US); Ting-Ta Yen, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 789 days.

(21) Appl. No.: 17/345,644

(22) Filed: Jun. 11, 2021

(65) Prior Publication Data

US 2022/0123715 A1    Apr. 21, 2022

Related U.S. Application Data

(60) Provisional application No. 63/132,704, filed on Dec. 31, 2020, provisional application No. 63/092,087, filed on Oct. 15, 2020.

(51) Int. Cl.
| | |
|---|---|
| *H03H 9/08* | (2006.01) |
| *H03H 3/04* | (2006.01) |
| *H03H 9/02* | (2006.01) |
| *H03H 9/17* | (2006.01) |
| *H03H 3/02* | (2006.01) |

(52) U.S. Cl.
CPC ............... *H03H 9/08* (2013.01); *H03H 3/04* (2013.01); *H03H 9/02102* (2013.01); *H03H 9/175* (2013.01); *H03H 2003/025* (2013.01); *H03H 2003/0407* (2013.01)

(58) Field of Classification Search
CPC ....... H03H 9/175; H03H 9/08; H03H 9/02102
See application file for complete search history.

(56) References Cited

U.S. PATENT DOCUMENTS

| | | | |
|---|---|---|---|
| 8,525,619 B1 | 9/2013 | Olsson et al. | |
| 9,793,877 B2 | 10/2017 | Martin et al. | |
| 2007/0052327 A1* | 3/2007 | Vilander | H03H 9/02834 |
| | | | 310/343 |

(Continued)

FOREIGN PATENT DOCUMENTS

| | | |
|---|---|---|
| RU | 2491712 C1 | 8/2013 |
| WO | WO2018022757 A1 | 2/2018 |

OTHER PUBLICATIONS

PCT Search Report, Application No. PCT/US 2021/053301, dated Nov. 25, 2021, 2 pages.

*Primary Examiner* — Bryan P Gordon
(74) *Attorney, Agent, or Firm* — Andrew R. Ralston; Frank D. Cimino

(57) ABSTRACT

An acoustic-wave device includes a first electrode located over a substrate. A piezoelectric film is located over the first electrode and at least partially overlaps the first electrode. A second electrode is located over the piezoelectric film and at least partially overlaps the first electrode and the piezoelectric film. A temperature sensor is located in a same layer level as the first or second electrode. A heater may also be located in a same layer level as the first electrode. A closed-loop system may operate using the temperature sensor and the heater to maintain an operating temperature that provides highly stable operation.

22 Claims, 10 Drawing Sheets

(56) References Cited

U.S. PATENT DOCUMENTS

| | | | |
|---|---|---|---|
| 2013/0300519 A1* | 11/2013 | Tamasaki | H03H 9/54 333/195 |
| 2014/0197714 A1* | 7/2014 | Martin | H03H 9/25 219/494 |
| 2016/0013771 A1* | 1/2016 | Sridaran | H03H 3/02 219/209 |
| 2016/0036411 A1* | 2/2016 | Shimodaira | H03H 9/08 310/345 |
| 2017/0026029 A1 | 1/2017 | Bahai et al. | |
| 2018/0226949 A1 | 8/2018 | Caron et al. | |
| 2020/0021272 A1 | 1/2020 | Fernandez et al. | |
| 2020/0076366 A1 | 3/2020 | Bahr et al. | |
| 2020/0280300 A1 | 9/2020 | Fernandez et al. | |

* cited by examiner

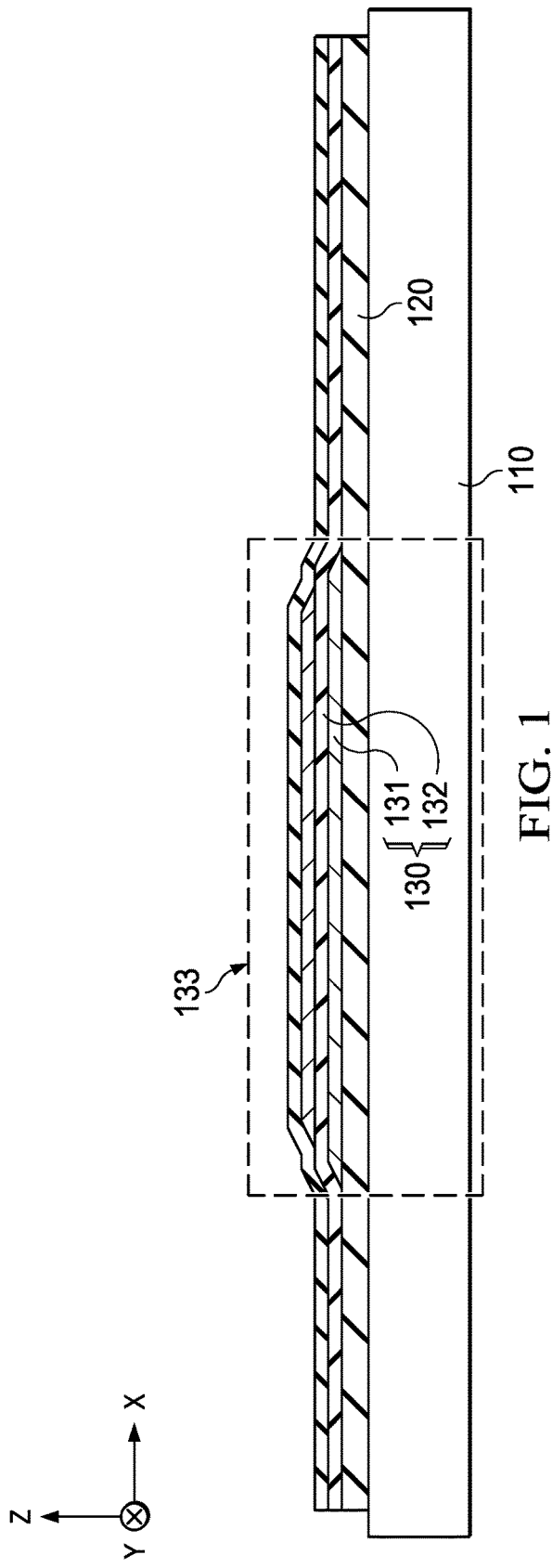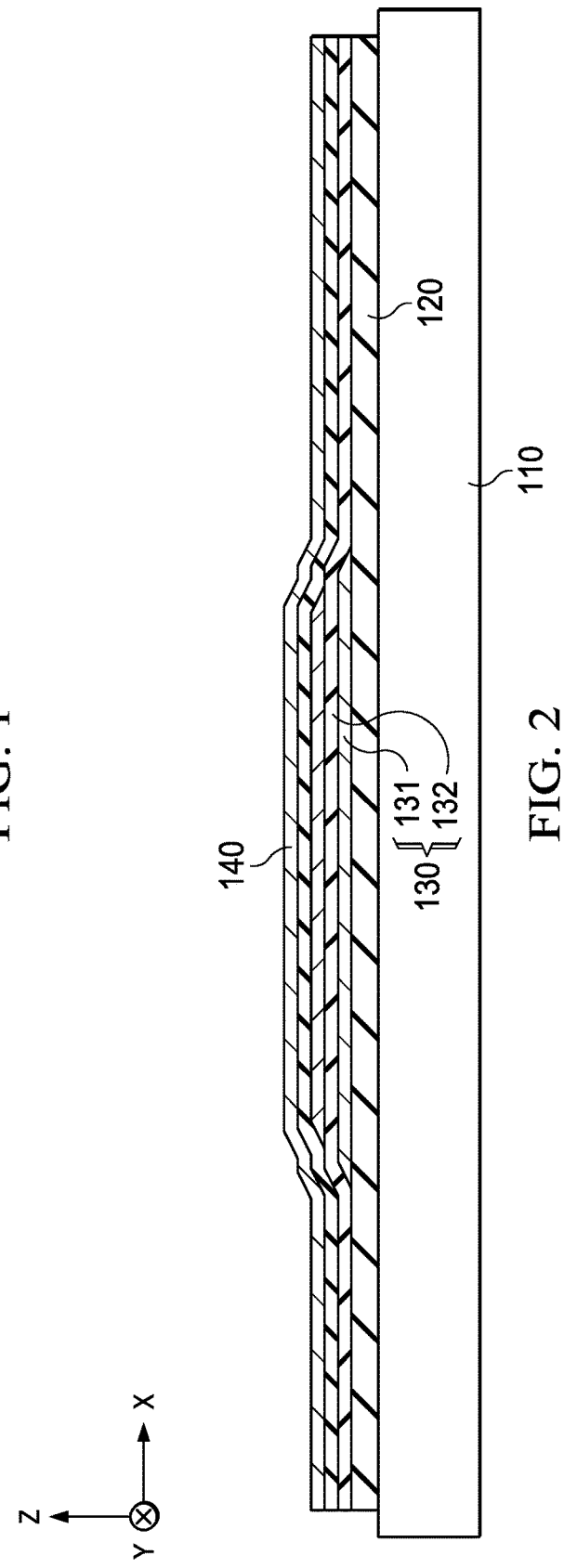

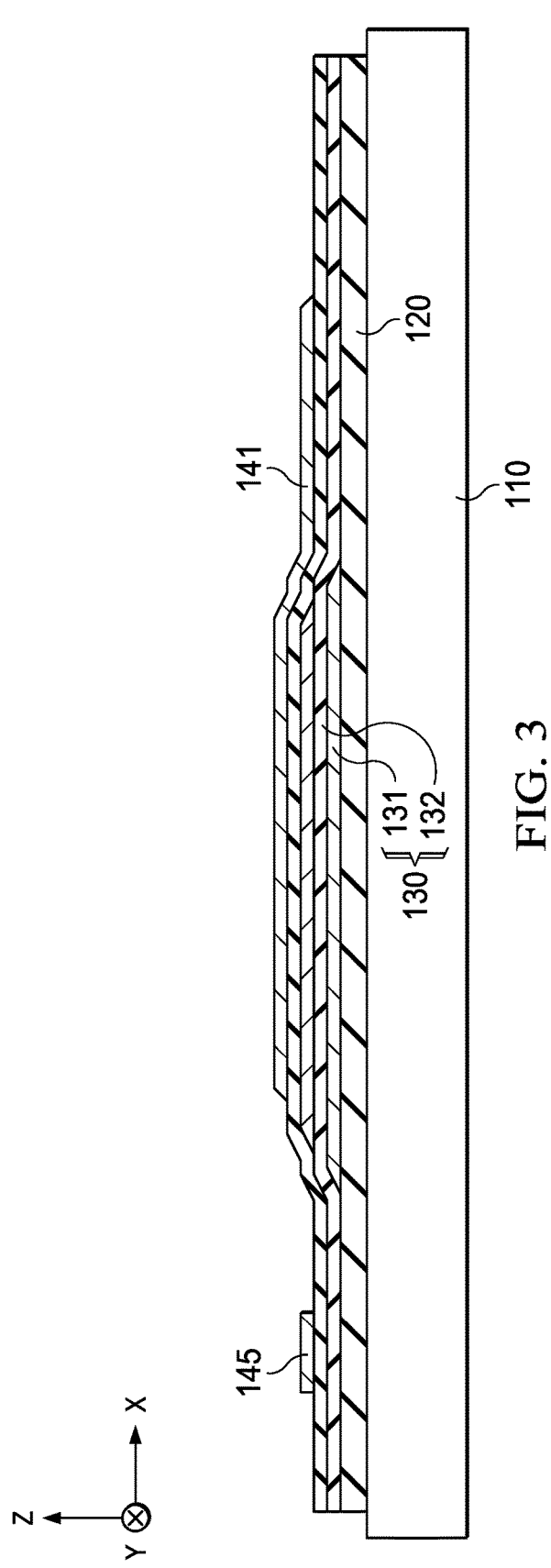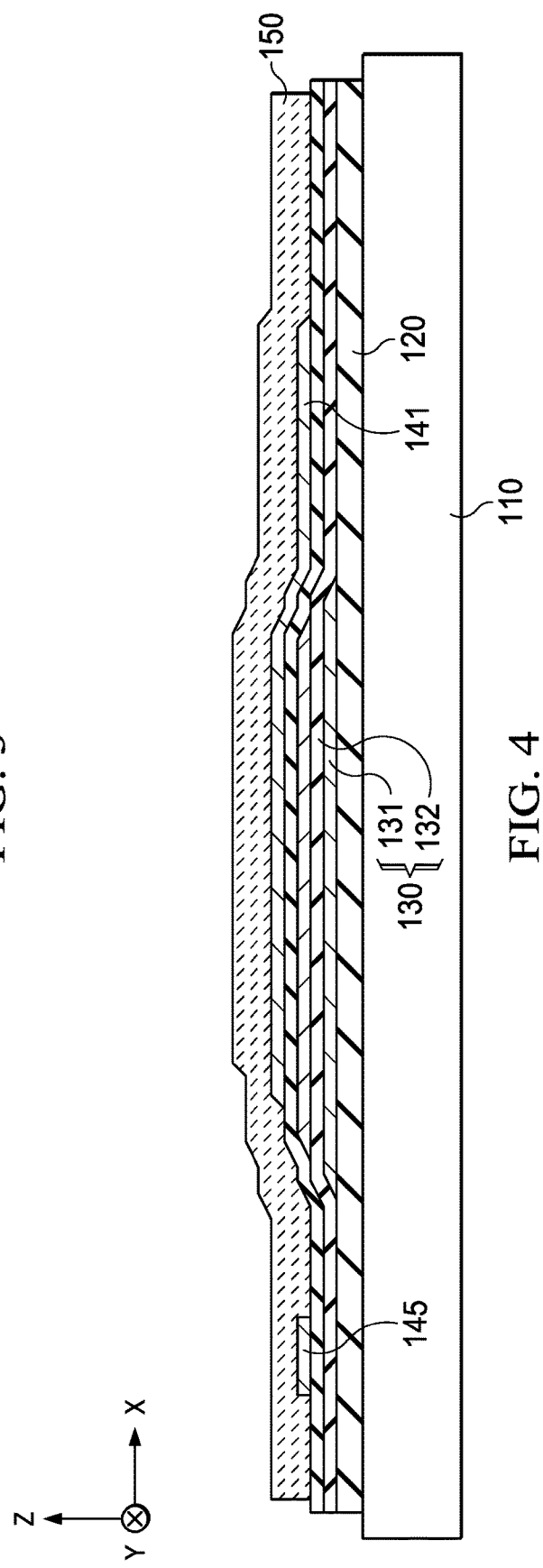

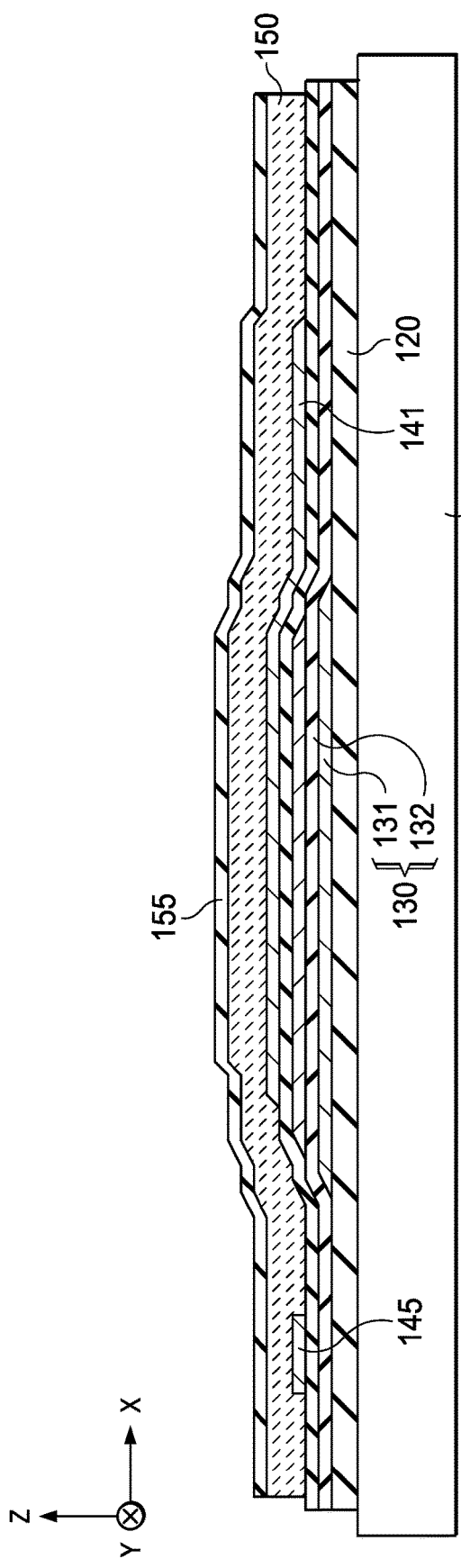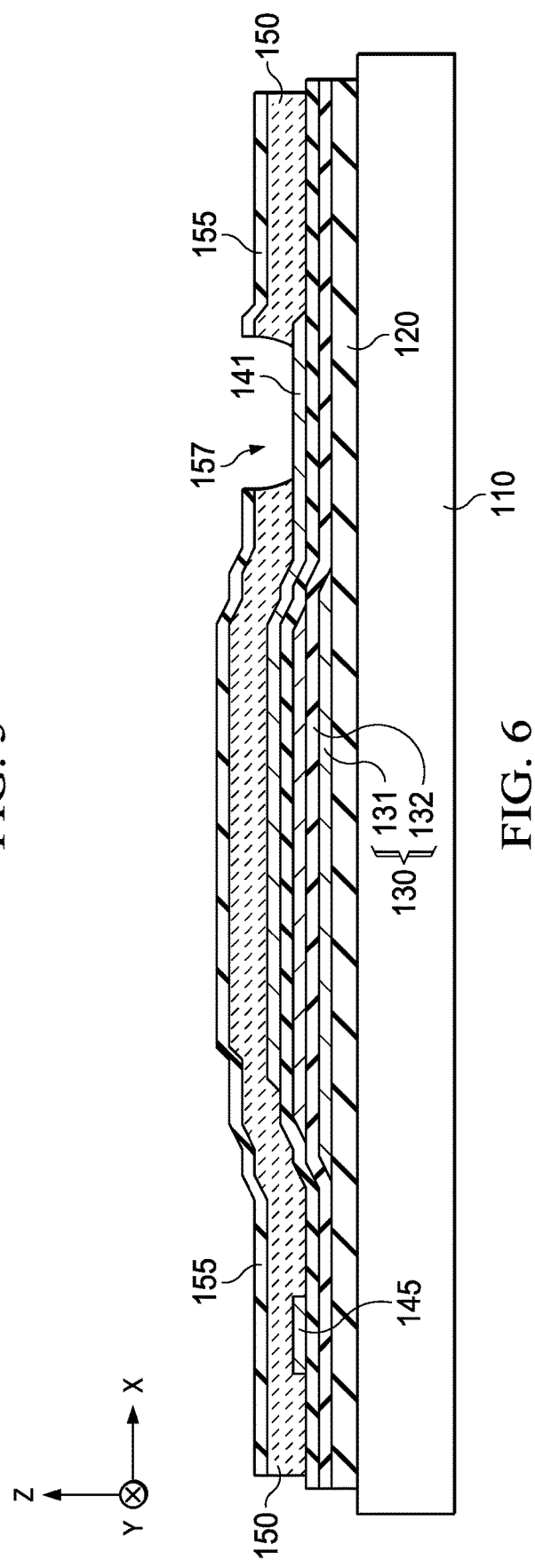

BULK ACOUSTIC WAVE DEVICE WITH INTEGRATED TEMPERATURE SENSOR AND HEATER

CROSS-REFERENCE TO RELATED APPLICATIONS

This application claims priority to U.S. Provisional Application No. 63/092,087, filed on Oct. 15, 2020, which is hereby incorporated by reference. This application further claims priority to U.S. Provisional Application No. 63/132,704, filed on Dec. 31, 2020, which is hereby incorporated by reference.

BACKGROUND

Bulk-acoustic-wave (BAW) resonators have a wide range of applications, such as applications in high stability oscillators. A BAW resonator includes a piezoelectric thin film between top and bottom electrodes, and may perform conversion between electrical energy and mechanical energy, and may generally operate at its mechanical resonant frequency.

SUMMARY

In one example, an acoustic-wave device includes a first electrode located over a substrate. A piezoelectric film located over the first electrode at least partially overlaps the first electrode. A second electrode over the piezoelectric film at least partially overlaps the first electrode and the piezoelectric film. A temperature sensor is formed in a same metal layer level as the first or second electrode.

In another example, an acoustic-wave device includes a first electrode over a substrate. A piezoelectric film is over the first electrode. A second electrode is over the piezoelectric film and the first electrode. A resistive heating element is located in a same metal layer level as the first electrode and laterally adjacent to the first electrode.

In some examples, an acoustic-wave device includes first and second metal layers over a substrate, the first metal layer including a first electrode and the second metal layer including a second electrode. A piezoelectric layer is located between the first and second electrodes, and a temperature-coefficient-of-frequency (TCF) dielectric layer is located between the piezoelectric layer and the second electrode. The TCF dielectric layer has a thickness such that an uncompensated temperature dependence of a resonant frequency of the piezoelectric layer has a local maximum above a rated operating temperature of the device. In some examples the local maximum is in a temperature within a range from about 90° C. to about 150° C.

In certain examples, a method of forming an electronic device includes forming a first electrode from a first metallic film over a substrate. A piezoelectric film is formed over the first electrode. A second metallic film is deposited over the piezoelectric film. A second electrode is formed from the second metallic film. A resistive heating element is formed from the first metallic film or the second metallic film.

BRIEF DESCRIPTION OF THE DRAWINGS

For a detailed description of various examples, reference will now be made to the accompanying drawings in which:

FIGS. 1-8 illustrate schematic views of the formation of a bulk-acoustic-wave (BAW) device according to described examples;

DETAILED DESCRIPTION

The frequency of a resonator is sensitive to the temperature of the active resonant region of the resonator. Using a temperature sensor on a base die of a multi-chip module (MCM) package may result in a large thermal gradient between the temperature sensor on the base die and the resonator located on a separate die. Temperature sensors based on a bipolar-junction-transistor (BJT) or N-Well architectures are difficult to be integrated with micro-electromechanical system (MEMS) technology, such as BAW technology.

The described examples include a bulk-acoustic-wave (BAW) device (e.g., a BAW resonator) having a heater in a same layer level as the first electrode of the BAW device, and/or a temperature sensor in a same layer level as the second electrode of the acoustic-wave device, and a method for forming the BAW device. As used herein, the term "layer level" refers to a stratum of a multilayer material stack. Two or more features in a same layer level will have substantially identical material composition, as the features are formed from a same material layer. The two or more features may be in a same layer level even if the features are noncontiguous. Furthermore, the two or more features may be at different heights above a supporting substrate when the material layer from which they are formed includes to topography due to underlying features. By integrating the temperature sensor in the same layer level as the second electrode of the BAW device, there is no need to add additional masks for fabrication, and thermal gradient between temperature sensor and the resonator of the BAW device may be reduced or eliminated. The temperature sensor may further be shaped and sized to serve as one or more resonate confiners of the BAW device. By integrating the heater in the same layer level as the first electrode of the BAW device, there is no need to add additional masks for fabrication. During the operation of the BAW device, the integrated heater may keep the BAW device at an elevated temperature constantly regardless of ambient conditions. Accordingly, the BAW device's frequency remains stable.

Further, the BAW device may also include a temperature-coefficient-of-frequency (TCF) dielectric layer that adjusts a TCF curve of the BAW device for the elevated temperature. The TCF dielectric layer can tune the turn-over temperature (TOT) of TCF curve of the BAW device to match the intended operating temperature of the integrated heater to reduce frequency shift with respect to temperature.

Figure 7:
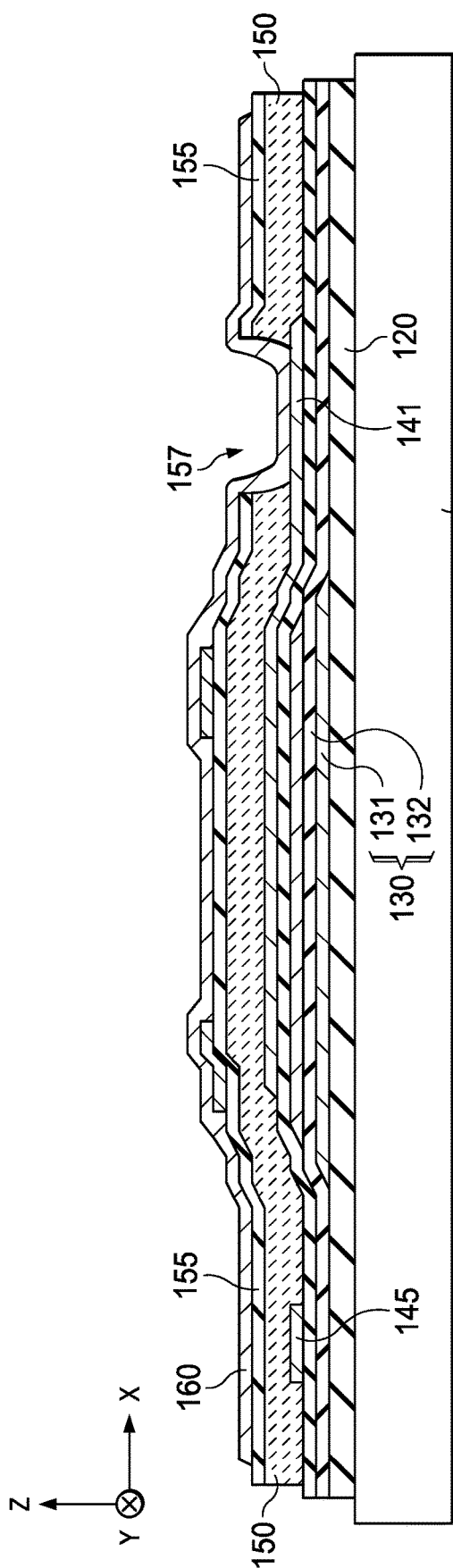
Figure 8:
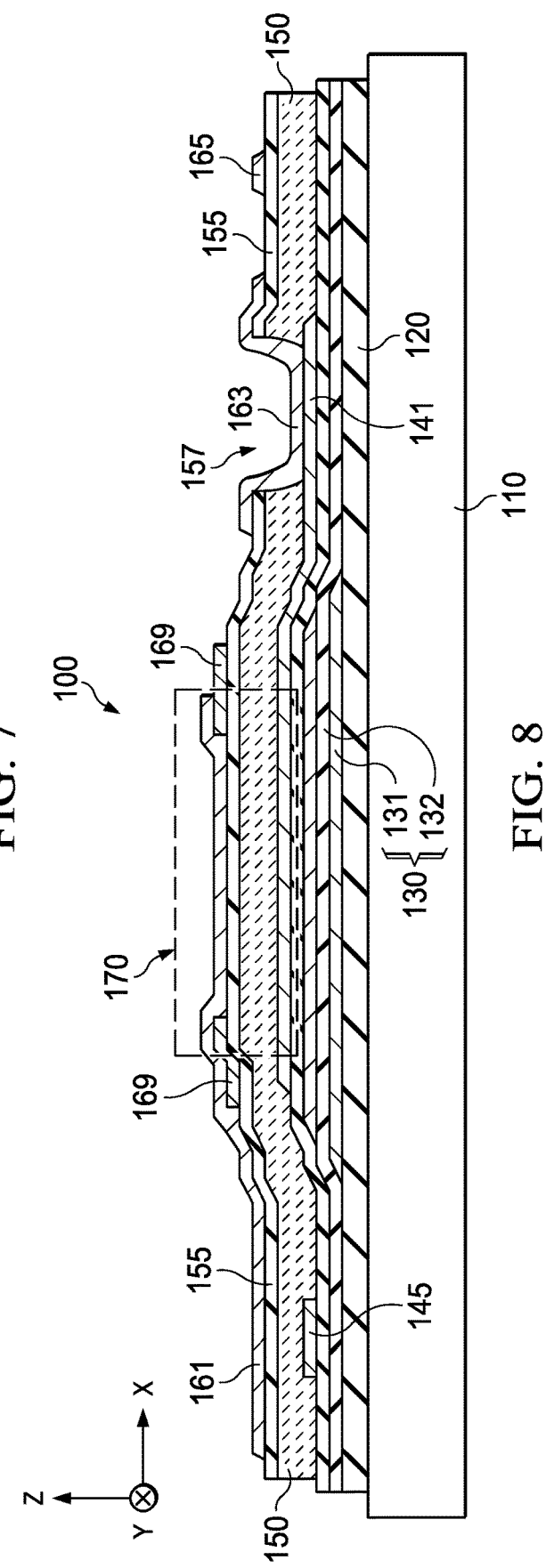
Figure 9:
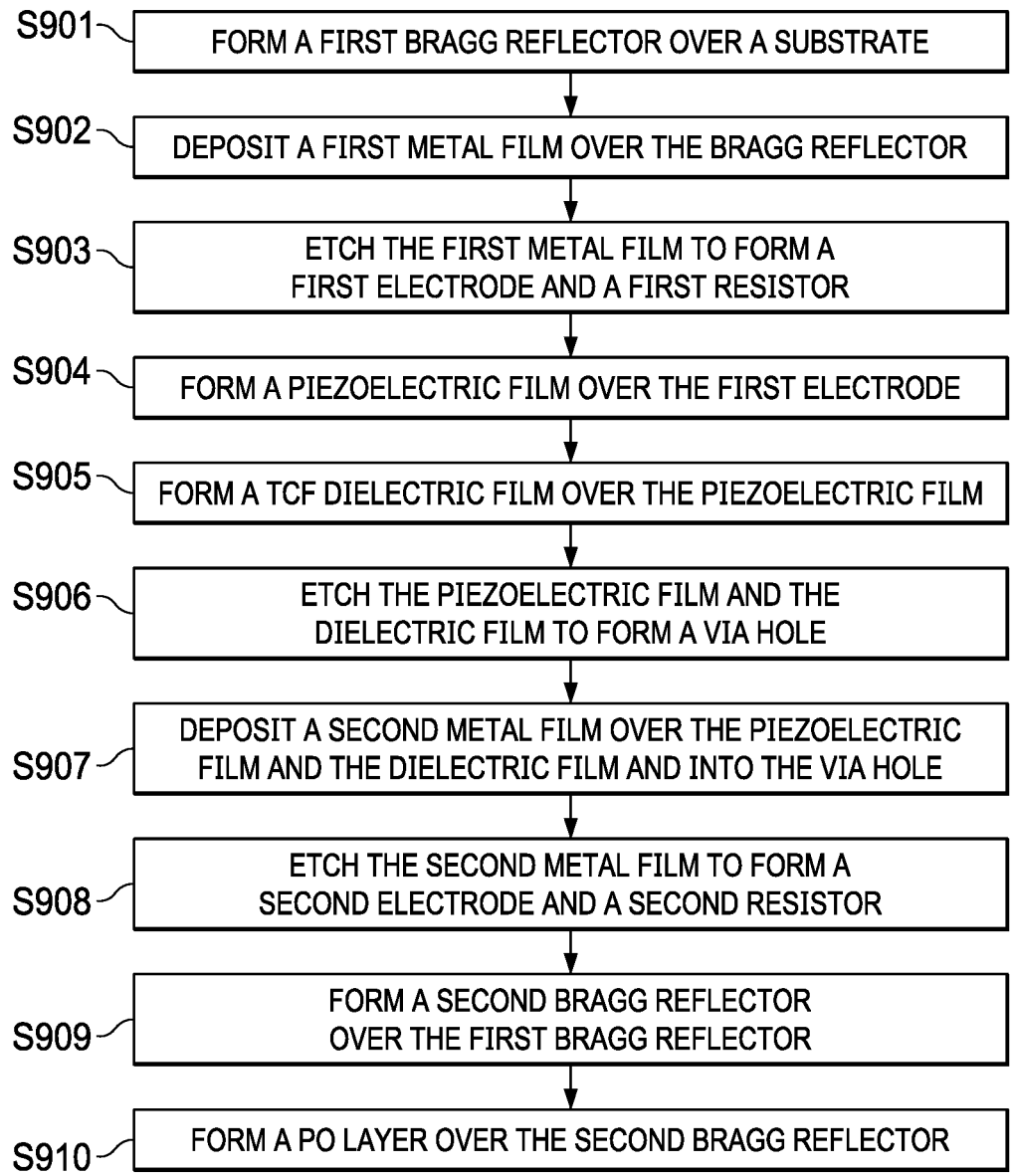
FIG. 9 illustrates a flow chart of an example method for forming a BAW device according to described examples.

FIGS. 1-8 illustrate schematic views of the formation of an example BAW device 100, and FIG. 9 illustrates a corresponding flow chart of an example method for forming the BAW device. FIGS. 1-8 will now be described along with references to the flow chart of FIG. 9.

FIG. 1 illustrates an oxide layer 120 (e.g., a thermal oxide layer) on a suitable substrate 110, e.g. a semiconductor such as silicon. A Bragg reflector 130 is located over the oxide layer 120 and the silicon substrate 110. FIG. 9 illustrates this step as forming a Bragg reflector on a substrate in step S901 in FIG. 9. FIG. 1 also illustrates a coordinate system having X, Y, and Z axes. The X-axis and the Y-axis are orthogonal to each other and are parallel to a plane of the silicon substrate 110. The X and Y-axes are thus referred to as "in-plane direction." The Z-axis is perpendicular to the X and Y-axes and thus perpendicular to the plane of the silicon substrate 110. As such, the Z-axis is referred to as an "out-of-plane direction."

The Bragg reflector 130 includes alternating acoustic impedance layers 131 and 132 in an overlap region 133. In the example of FIG. 1, the acoustic impedance layers 132 extend out of the overlap region 133 and extend longer than the acoustic impedance layers 131. In other examples, the acoustic impedance layers 131 extends together with the acoustic impedance layers 132 in the in-plane directions; and accordingly, sizes of the overlap region 133 in the in-plane directions are increased. In one example, the acoustic impedance layers 131 have relatively higher acoustic impedance than the acoustic impedance layers 132. In some examples, the impedance of the acoustic impedance layers 131 is larger than $20 \times 10^6$ kg/m²s; and the impedance of the acoustic impedance layers 132 is equal to or less than $20 \times 10^6$ kg/m²s. In some examples, a material of the acoustic impedance layers 131 includes tungsten, titanium tungsten or copper; and a material of the acoustic impedance layers 132 includes silicon dioxide, or aluminum nitride.

The alternating acoustic impedance layers 131 and 132 of the Bragg reflector 130 may be formed by deposition for the layers, followed by patterning and etching of the layers in order to define desired sizes and shapes of the Bragg reflector. The shape may be defined, e.g. by repeating the deposition, patterning and etching steps in an iterative process until a desired number of alternating acoustic impedance layers 131 and 132 of the Bragg reflector is achieved.

FIG. 2 illustrates a metal film 140 on the Bragg reflector 130. FIG. 9 illustrates this step as depositing a first metal film on the Bragg reflector in step S902 of FIG. 9. A material of the metal film 140 may include at least one of molybdenum, platinum, or aluminum. In some examples, the metal film 140 is deposited using vapor deposition, such as chemical vapor deposition (CVD) or physical vapor deposition (PVD).

FIG. 3 illustrates a bottom electrode 141 and a resistor 145 on the Bragg reflector 130. The resistor 145 may be configured to operate as a resistive heater, and may be referred to as a resistive heater herein. FIG. 9 illustrates this step as etching the first metal film to form a first electrode and a heater in step S903 of FIG. 9. The bottom electrode 141 and the heater 145 may be formed by etching the metal film 140 using a same mask. Thus the bottom electrode 141 and the heater 145 in this example are formed in a same layer level, though in some cases as shown the bottom electrode and the heater 145 are located at different heights above the substrate 110. Accordingly, there is no need to add additional masks for forming the heater 145.

FIG. 4 illustrates a piezoelectric film 150 on the bottom electrode 141, the heater 145, and the Bragg reflector 130. FIG. 9 illustrates this step as forming a piezoelectric film on the first electrode in step S904 of FIG. 9. In some examples, the piezoelectric film 150 is deposited using chemical vapor deposition or physical vapor deposition. The piezoelectric film 150 may include AlN, ZnO or lead zirconate titanate (PZT).

FIG. 5 illustrates a dielectric film 155 on the piezoelectric film 150. FIG. 9 illustrates this step as forming a dielectric film on the piezoelectric film in step S905 of FIG. 9. In some examples, the dielectric film 155 has an elastic modulus temperature coefficient which is opposite an elastic modulus temperature coefficient of the piezoelectric film 150, so as to allow for a net stress effect of zero to be achieved across temperature. In some examples, the dielectric film 155 is formed using vapor deposition such as chemical vapor deposition. In some examples, a material of the dielectric film 155 includes silicon dioxide.

FIG. 6 illustrates a via hole 157 in the dielectric film 155 and the piezoelectric film 150. FIG. 9 illustrates this step as etching the piezoelectric film and the dielectric film to form a via hole in step S906 of FIG. 9. In some example, the via hole 157 is formed by etching away portions of the dielectric film 155 and the piezoelectric film 150 exposed by a mask (not shown).

FIG. 7 illustrates a metal film 160 on the dielectric film 155, the piezoelectric film 150, and the bottom electrode 141, and in the via hole 157. FIG. 9 illustrates this step as depositing a second metal film on the piezoelectric film and the dielectric film in step S907 of FIG. 9. In some examples, the metal film 160 is deposited using chemical vapor deposition or physical vapor deposition.

FIG. 8 illustrates a top electrode 161 and a resistor 165 on the dielectric film 155 and piezoelectric film 150, and a via 163 in the via hole 157 and in contact with the bottom electrode 141. FIG. 9 illustrates this step as etching the second metal film to form a second electrode, a resistor, and a via in step S908 of FIG. 9. The resistor 165 may be configured to operate as a temperature sensor, and may be referred to as such. The top electrode 161, the temperature sensor 165, and the via 163 may be formed by etching the metal film 160, and thus may be formed from a same metal layer level, though the top electrode 161 and the temperature sensor 165 may be located at different heights above the substrate 110. The metal film 160 may be etched using a same mask to etch away certain portions of the metal film 160 and to protect the portions of the metal film 160 corresponding to the top electrode 161, the temperature sensor 165, and the via 163 from being etched away. Accordingly, there is no need to add additional masks for forming the temperature sensor 165 and the via 163.

FIG. 8 illustrates a schematic view of an example BAW device 100 according to described examples. Referring to FIG. 8, the BAW device 100 includes the silicon substrate 110, the oxide layer 120, the Bragg reflector 130, the bottom electrode 141 and the heater 145, the piezoelectric film 150, the dielectric film 155, the top electrode 161 and the temperature sensor 165, and the via 163 in the via hole 157. The Bragg reflector 130 is on the oxide layer 120 and the silicon substrate 110. The bottom electrode 141 and the heater 145 are located over or on the Bragg reflector 130. The piezoelectric film 150 is over or on the bottom electrode 141, the heater 145, and the Bragg reflector 130. In some examples, a material of the piezoelectric film 150 includes aluminum nitride, zinc oxide, or any other suitable piezoelectric material. The top electrode 161 and the temperature sensor 165 are on the dielectric film 155 and piezoelectric film 150. The bottom electrode 141, the piezoelectric film 150, and the top electrode 161 at least partially overlap. The overlap region may be referred to herein as an active region 170.

In the example of FIG. 8, the BAW device 100 further includes a leakage-suppression structure 169 to suppress leakage of lateral energy, e.g., along the in-plane direction (X-axis). The leakage-suppression structure 169, e.g., a guard ring, may include metal, and may be formed by physical vapor deposition of a metal layer, patterning, and etching.

In the examples of FIG. 8, the Bragg reflector 130 is included to reduce acoustic energy leaking. In other examples, an air gap is used to replace the Bragg reflector 130 for the purposes of reducing acoustic energy leaking.

By integrating the temperature sensor 165 in the same layer level as the top electrode 161 of the BAW device 100, a thermal gradient between the temperature sensor 165 and the piezoelectric film 150 in the active region 170 may be reduced or nearly eliminated. Accordingly, frequency errors across temperature due to thermal gradient between a temperature sensor and an active region of a BAW device during active temperature frequency compensation can be reduced or eliminated.

By integrating the heater 145 in the same layer as the bottom electrode 141 of the BAW device 100, there is no need to add additional masks for fabrication of the heater 145. During the operation of the heater 145, the integrated heater 145 may keep the BAW device 100 at a constant elevated temperature regardless of ambient conditions, e.g., a temperature higher than the temperature of the ambient conditions. Accordingly, the BAW device 100's frequency may remain stable.

In the example of FIG. 8, the temperature sensor 165 is in the same layer as the top electrode 161 of the BAW device 100, and the heater 145 is in the same layer as the bottom electrode 141 of the BAW device 100. In some other examples, the temperature sensor is in the same layer as the bottom electrode of a BAW device, and the heater is in the same layer as the top electrode of the BAW device. In another example, the temperature sensor and the heater are in the same layer as one of the bottom and top electrodes of a BAW device. The layer in which the heater and/or the temperature sensor stay, e.g., layers corresponding to the top electrode and/or bottom electrode, may be chosen according to various application scenarios.

Figure 10:
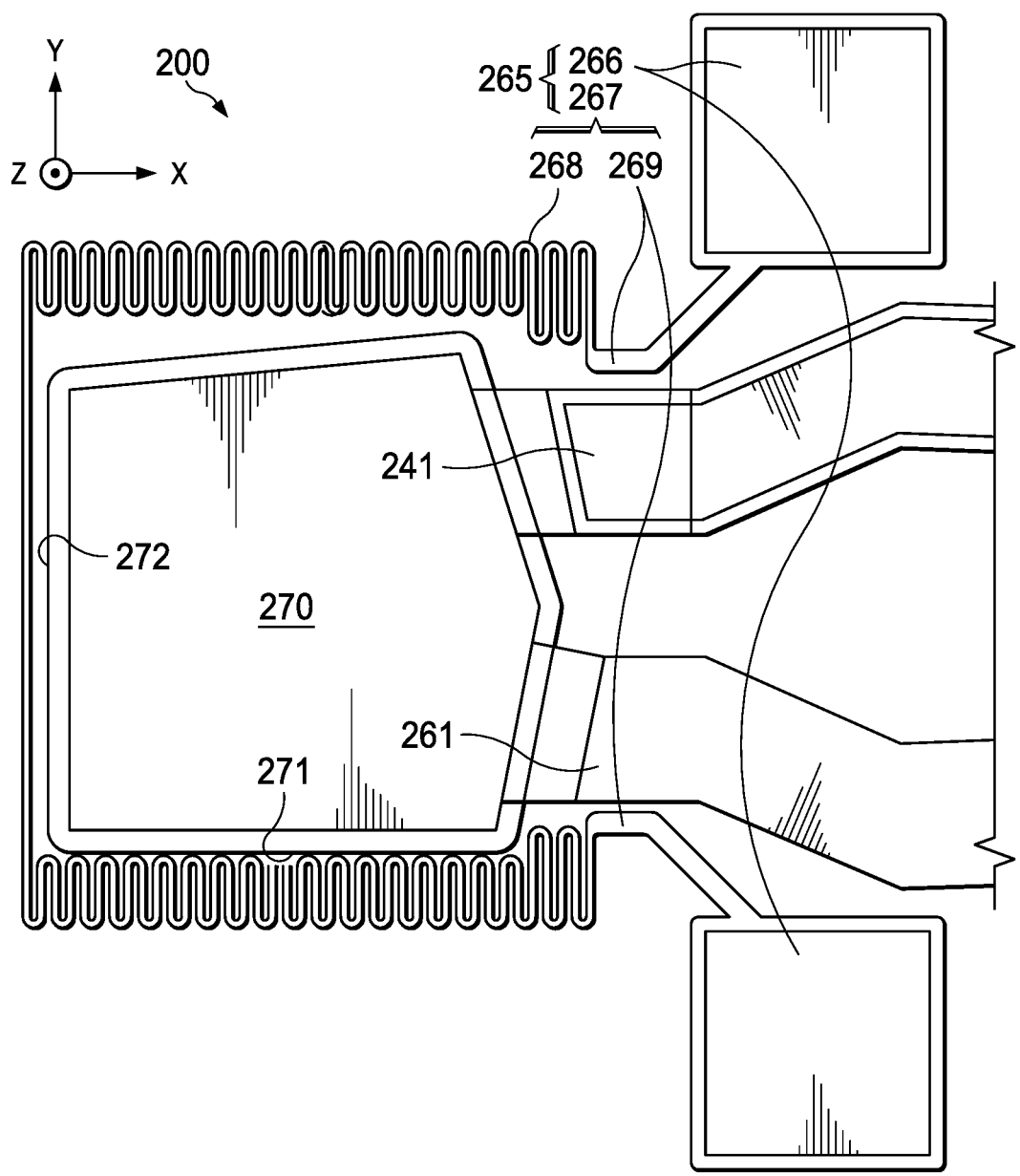
FIG. 10 illustrates a schematic view of another example BAW device according to described examples.

FIG. 10 illustrates a schematic view of another example BAW device 200 according to described examples. The BAW device 200 includes an active region 270 having multiple edges (e.g., 271, 272), a bottom electrode 241, a top electrode 261, and a temperature sensor 265. The temperature sensor 265 is in a same layer as the top electrode 261. The temperature sensor 265 and the top electrode 261 may be formed together by etching a same metal film using a same mask, where a material of the metal film may include at least one of molybdenum, platinum, or aluminum, or include any other suitable metal. Accordingly, the material of the temperature sensor 265 and the top electrode 261 may include at least one of molybdenum, platinum, or aluminum, or include any other suitable metal. The temperature sensor 265 includes a resistive member 267 and first and second signal terminals 266. The resistive member 267 includes first and second ends 269 and multiple line segments 268. The multiple line segments meander between the first and second ends 269 and are shaped and sized to have a desired electrical resistance. The first and second signal terminals 266 are coupled to the first and second ends 269, respectively.

The temperature sensor 265 may be a metal-resistor based temperature sensor, where the resistance of the temperature sensor changes linearly as the temperature changes. For example, the resistance of the temperature sensor 265 may have a linear relationship with the temperature being measured. According to the relationship between the resistances and the temperatures, a temperature can be determined based on the resistance. For example, via the first and second signal terminals 266, a constant current can be introduced to pass the multiple line segments 268. By measuring voltages across the first and second signal terminals 266, the corresponding resistance can be determined, and accordingly the temperature can be determined. The linear relationship between the resistances and the temperatures may improve the temperature measurement, and may reduce frequency errors during active temperature compensation during steady-state thermal conditions due to non-linearity in a temperature sensor.

Figure 11:
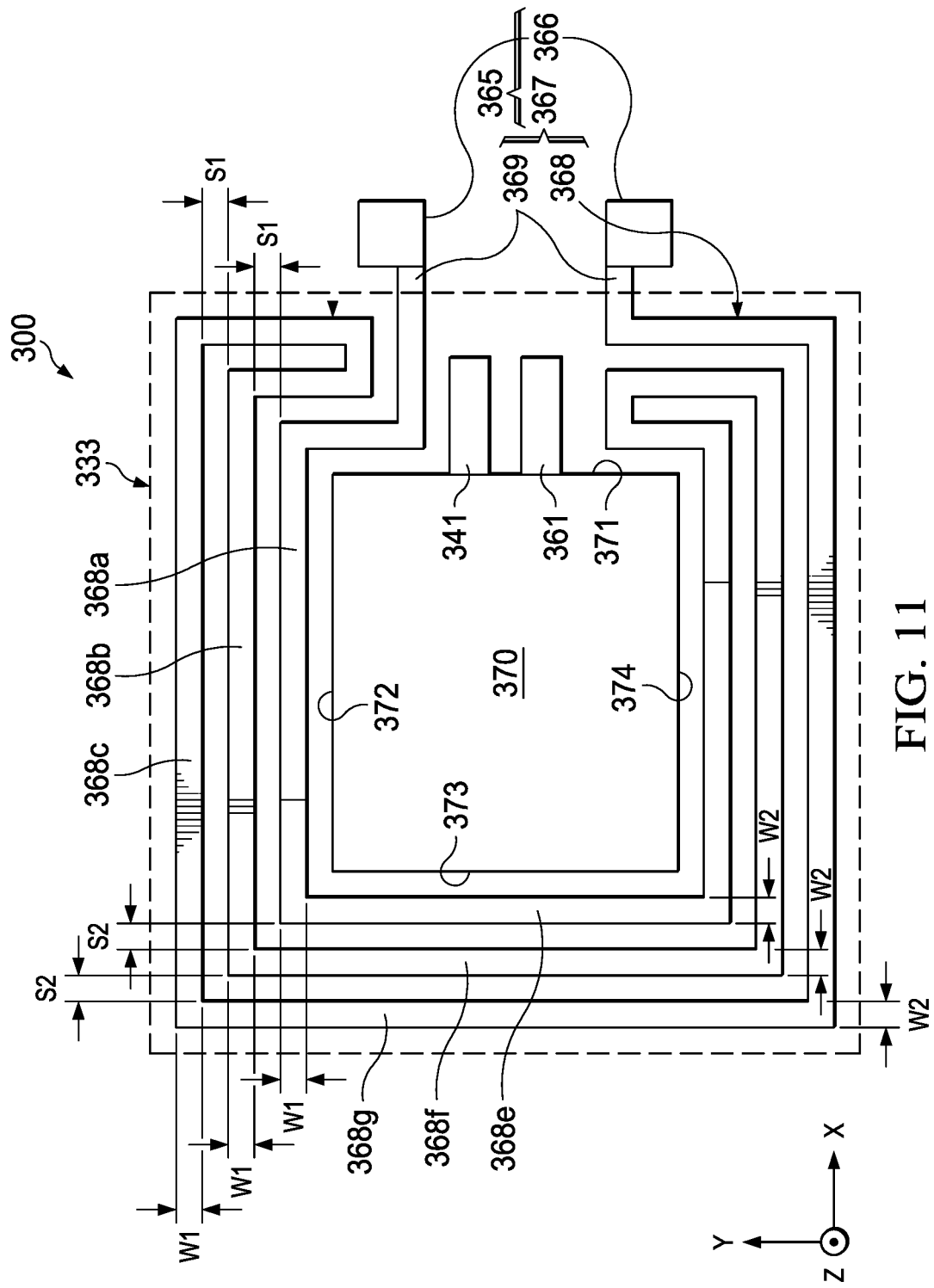
FIG. 11 illustrates a schematic view of another example BAW device according to described examples.

FIG. 11 illustrates a schematic view of another example BAW device 300 according to described examples. The BAW device 300 includes an active region 370 having multiple edges 371, 372, 373 and 374, a bottom electrode 341, a top electrode 361, and a temperature sensor 365. The temperature sensor 365 may be in a same layer as a top electrode 361. The temperature sensor 365 and the top electrode 361 may be formed together by etching a same metal film using a same mask, where a material of the metal film may include at least one of molybdenum, platinum, or aluminum, or include any other suitable metal. Accordingly, the material of the temperature sensor 365 and the top electrode 361 may include at least one of molybdenum, platinum, or aluminum, or include any other suitable metal. The temperature sensor 365 includes a resistive member 367 and first and second signal terminals 366. The resistive member 367 includes first and second ends 369 and multiple line segments 368. The first and second signal terminals 366 are coupled to the first and second ends 369, respectively. The multiple line segments 368 are between the first and second ends 369. In the examples of FIG. 11, The multiple line segments 368 are shaped and sized, such that the temperature sensor 365 can serve as a temperature sensor and one or more resonate confiners. Resonant confiners are described in greater detail in publication US20200280300A1, incorporated herein by reference in its entirety.

In the example of FIG. 11, the multiple line segments 368 includes one or more groups of line segments 368, e.g., a first group of line segments 368a, 368b, and 368c, and a second group of line segments 368e, 368f, and 368g, etc. In some examples, each group of line segments 368 of the one or more groups of line segments 368 are parallel to an edge (e.g., 371, 372, 373, 374) of the active region 370. For example, the first group of line segments 368a, 368b, and 368c are parallel to the edge 372. As another example, the second group of line segments 368e, 368f, and 368g are parallel to the edge 373. In some examples, each group of line segments 368 of the one or more groups of line segments 368 have line widths equal to half a wavelength of a propagating acoustic wave of the BAW device 300, and line separation distances equal to half a wavelength of the propagating acoustic wave of the BAW device 300. For example, the first group of line segments 368a, 368b, and 368c have line widths W1 equal to half a wavelength of the propagating acoustic wave of the BAW device 300, and line separation distances S1 equal to half a wavelength of a propagating acoustic wave of the BAW device 300. As another example, the second group of line segments 368e, 368*f*, and 368*g* have line widths W2 equal to half a wavelength of the propagating acoustic wave of the BAW device 300, and line separation distances S2 equal to half a wavelength of the propagating acoustic wave of the BAW device 300. Accordingly, the temperature sensor 365 can serve as a temperature sensor and as a resonate confiner.

In the example of FIG. 11, one or more groups of line segments 368 of the multiple line segments 368 that serve as resonate confiners are within a vibration region 333 of the BAW device 300. In some examples, the vibration region 333 correspond to a region of a Bragg reflector or an air gap (not shown in FIG. 11) further included in the BAW device 300, and orthogonal projections of the one or more group of line segments 368 on a substrate (not shown in FIG. 11) of the BAW device 300 are within an projection orthogonal to the underlying substrate (not shown), e.g. a footprint or lateral extent, of the Bragg reflector or the air gap on the substrate.

Figure 12:
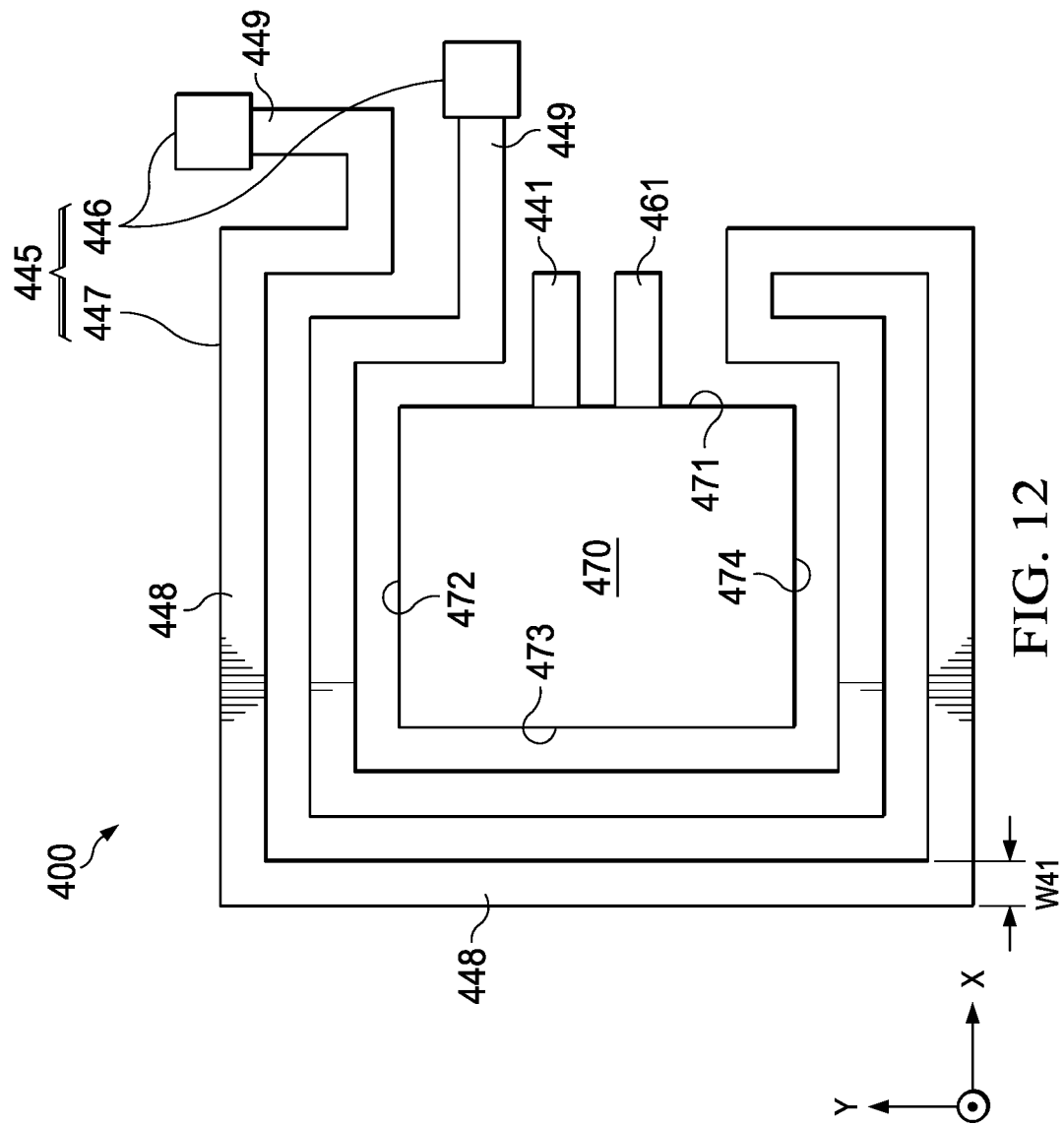
FIG. 12 illustrates a schematic view of another example BAW device according to described examples.

FIG. 12 illustrates a schematic view of another example BAW device 400 according to described examples. The BAW device 400 includes an active region 470 having multiple edges 471, 472, 473 and 474, a bottom electrode 441, a top electrode 461, and a resistor 445 that may be used for resistive heating or temperature sensing. In some examples, the resistor 445 is in a same layer as the bottom electrode 441. The resistor 445 and the bottom electrode 441 may be formed together by etching a same metal film using a same mask, where a material of the metal film may include at least one of molybdenum, platinum, or aluminum, or include any other suitable metal. Accordingly, the material of the resistor 445 and the bottom electrode 441 may include at least one of molybdenum, platinum, or aluminum, or include any other suitable metal. The resistor 445 includes first and second power terminals 446 and a heater member 447. The heater member 447 includes first and second ends 449 and multiple lines 448 between the first and second ends 449. In the example of the FIG. 12, the heater member 447 is serpentine, and the multiple lines 448 meander between the first and second ends 449. The first and second power terminals 446 are coupled to the first and second ends 449, respectively. The first and second power terminals 446 may be configured to receive heating power and provide the heating power to the heater member 447. In some examples, widths W41 of the multiple lines 448 of the heater member 447 may be larger than a line width of an integrated temperature sensor, such as line widths W1 of the first group of line segments 368*a*, 368*b*, and 368*c* of the BAW device 300 in FIG. 11.

The example of BAW device 400 provides that the first and second power terminals 446 are both located on one side of the active region 470. This configuration may be described as the first and second power terminals 446 being immediate neighbors. This configuration may advantageous in some applications in which inductive noise might otherwise interfere with operation of the BAW device 400. This configuration may be used for either the heater resistor, the sense resistor, or both.

Figure 13:
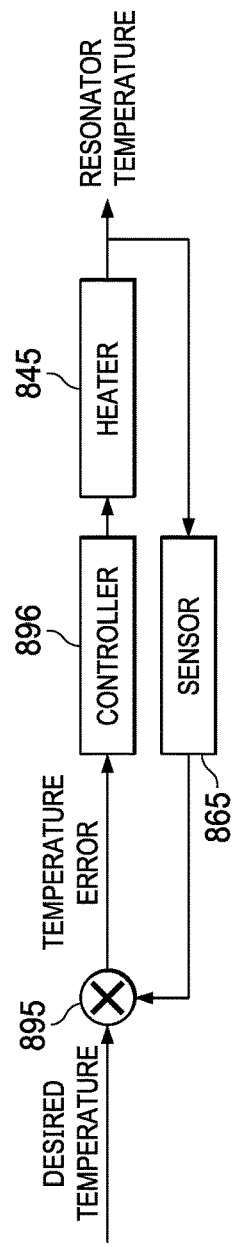
FIG. 13 illustrates a schematic diagram of an example closed-loop configuration for heater according to described examples.

FIG. 13 illustrates a schematic diagram of an example closed-loop configuration for heater according to described examples. An error-determination circuit 895 receives a value of a target temperature for a BAW device (e.g., BAW devices 100, 400) and a value of a real-time temperature of the BAW device detected by a temperature sensor 865 of the BAW device, e.g. a real-time temperature of active region of the BAW device. A target temperature of a BAW device may be an elevated temperature above a temperature of ambient conditions. In some examples, the elevated temperature is a temperature above room temperature (e.g., 20° C.) and equal to or less than 200° C. In certain examples, the elevated temperature is a temperature in a range of approximately 100° C. to 120° C. The error-determination circuit 895 calculate a temperature error (e.g., temperature difference) between the target temperature and the real-time temperature of the BAW device, and output the temperature error to a controller 896. The controller 896 is configured to control a heater 845 of the BAW device according to a signal from the temperature sensor 865 that indicate the real-time temperature of the BAW device, and according to the target temperature. The signal may result from a temperature-dependent property of the temperature sensor 865, e.g. resistance. The controller 896 may be an internal controller included in the BAW device or an external controller.

The controller 896 controls a heater 845 of the BAW device to adjust the real-time temperature of the BAW device. For example, if the temperature error indicates the real-time temperature is less than the target temperature, the controller 896 increases or provide a heating power of the heater 845 of the BAW device so as to increases the real-time temperature of the BAW device until the real-time temperature reaches or approximately reaches the target temperature; if the temperature error indicates the real-time temperature is higher than the target temperature, the controller 896 reduce a heating power of the heater 845 of the BAW device so as to decrease the real-time temperature of the BAW device until the real-time temperature reaches or approximately reaches the target temperature. Such control process may be repeated, so as to stabilize the real-time temperature of the BAW device at or approximately at the target temperature. Accordingly, the BAW device may be at a constant elevated temperature above a temperature of the ambient conditions; and the frequency of the BAW device may also remain constant. In the example of FIG. 13 for the closed-loop configuration, the real-time temperature of the BAW device can be detected by the temperature sensor 865 by monitoring the voltage of the temperature sensor 865, as temperature changes in the BAW device cause changes in the resistance of the temperature sensor 865, and changes in the voltage of the temperature sensor 865 with a constant current in the temperature sensor 865.

In the examples of FIG. 13, a closed-loop configuration is used for a heater consistent with the present disclosure. In other examples, an open-loop configuration (e.g., omitting the feedback path from the resonator temperature to the error-determination circuit 895) is used for a heater consistent with the present disclosure.

In some examples for the open-loop configuration, the desired power to reach the desired operating temperature can be determined with high accuracy through theoretical simulations of the device and package system. The resistance of the heater can be set to a target value through design and controlled with good tolerance through manufacturing control. Further, the resistance can either be assumed based on the design with some error due to process variation; or for more precise applications, the resistance for each die can be measured in order to eliminate or reduce any error from process variation. Accordingly, the resistance value is a known variable. With the desired power (P) known, and the heater's resistance (R) known, the power into the heater can then be controlled by controlling the voltage as a function of V=sqrt(P*R). Further, such power is provided to and received by a heater of the BAW device, so as to cause a real-time temperature of the BAW device to be at or approximately at the target temperature, and/or to keep the real-time temperature of the BAW device at or approximately at the target temperature.

Figure 14:
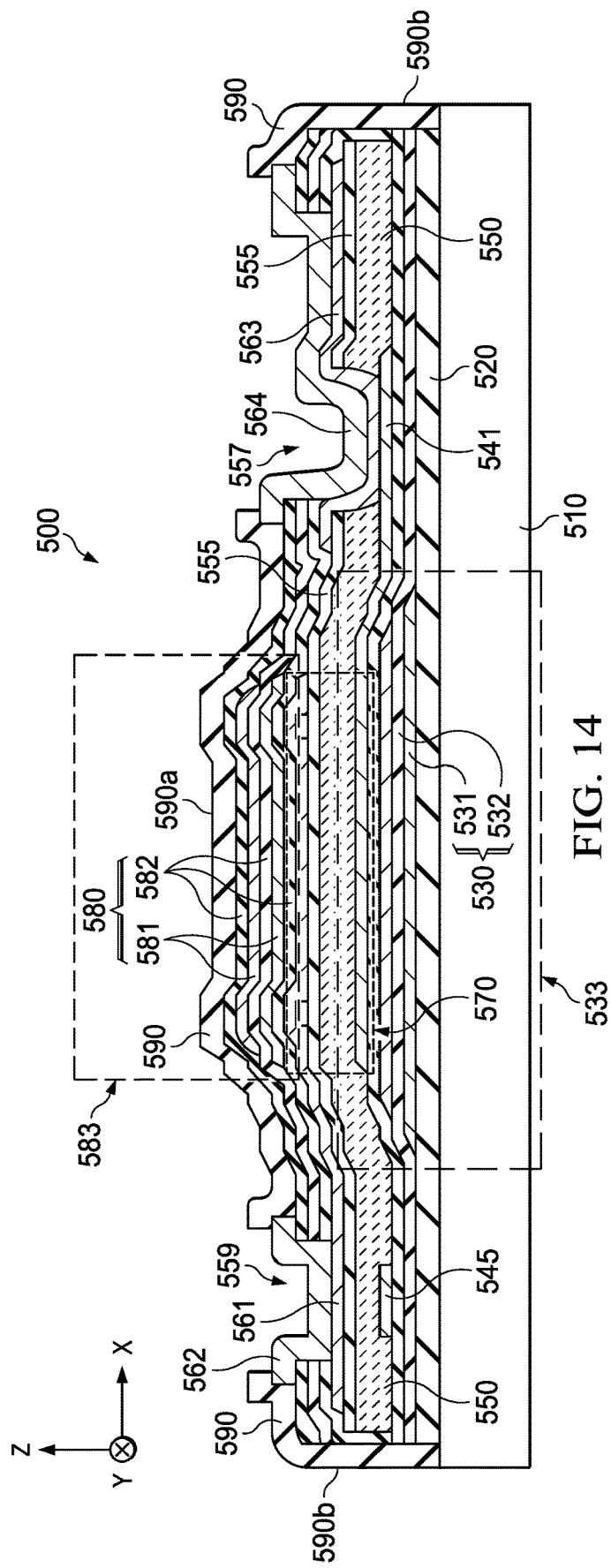
FIG. 14 illustrates a schematic view of another example BAW device according to described examples.

FIG. 14 illustrates a schematic view of another example BAW resonator 500 according to described examples. The BAW resonator 500 includes a silicon substrate 510, an oxide layer 520, a Bragg reflector 530, a bottom electrode 541, a heater 545, a piezoelectric film 550, a dielectric film, or layer, 555, a top electrode 561, a via 562 in a via hole 559, vias 563, 564 in a via hole 557, a Bragg reflector 580, and a dielectric layer 590. The Bragg reflector 580 and the dielectric layer 590 may be respectively formed in steps S909 and S910 FIG. 9. Optionally the resonator 500 also includes a resistive temperature sensor (not shown), exemplified by the temperature sensor 165.

The Bragg reflector 530 is on the oxide layer 520 and the silicon substrate 510. The bottom electrode 541 and the heater 545 are on the Bragg reflector 530. The piezoelectric film 550 is on the bottom electrode 541, the heater 545, and the Bragg reflector 530. The top electrode 561 is over the dielectric film 555 and piezoelectric film 550. The bottom electrode 541, the piezoelectric film 550, and the top electrode 561 at least partially overlap, and the overlap region forms an active region 570. The Bragg reflector 580 is over the top electrode 561, the dielectric film 555, and piezoelectric film 550. The dielectric layer 590 is over the Bragg reflector 580, including some portions 590a that extend in a direction parallel to the substrate 510 and some other portions 590b that extend in a direction orthogonal to the substrate 510. The dielectric layer 590 may act as a passivation overcoat of the BAW resonator 500.

The Bragg reflector 530 includes alternating acoustic impedance layers 531 and 532 in an overlap region 533. In the example of FIG. 14, the acoustic impedance layers 532 extend out of the overlap region 533 beyond the acoustic impedance layers 531. In other examples, the acoustic impedance layers 531 extends together with the acoustic impedance layers 532, e.g., in one or more in-plane directions; and accordingly the overlap region 533 is enlarged, e.g., in the one or more in-plane directions. In one example, the acoustic impedance layers 531 have relatively higher acoustic impedance than the acoustic impedance layers 532.

The Bragg reflector 580 includes alternating acoustic impedance layers 581 and 582 in an overlap region 583 of acoustic impedance layers 581, 582. In the example of FIG. 14, the acoustic impedance layers 582 extend out of the overlap region 583 beyond the acoustic impedance layers 581. In other examples, the acoustic impedance layers 581 extend together with the acoustic impedance layers 582, e.g., in one or more in-plane directions; and accordingly the overlap region 583 is enlarged, e.g., in the one or more in-plane directions. In one example, the acoustic impedance layers 581 may have relatively higher acoustic impedance than the acoustic impedance layers 582.

The dielectric film 555 may be over or in the active region 170. Preferably the dielectric film 555 has an elastic modulus temperature coefficient which is of opposite sign of the piezoelectric film 550. By tuning the thickness of the dielectric film 555, the net elastic modulus temperature coefficient of the active region 170 may be configured to zero around a turn-over-temperature (TOT) of the uncompensated frequency error of the BAW resonator 500. This aspect is addressed in greater detail below. The dielectric film 555 may be primarily silicon oxide, primarily silicon nitride, or may include nonzero fractions of both silicon oxide and silicon nitride, e.g. silicon oxynitride. The dielectric film 555 may be formed as a single layer as shown or may include multiple material layers each having a same or different composition. The dielectric film 555 may be formed by CVD deposition or ALD (atomic layer deposition), and may be formed using process conditions that result in low stress for reducing long-term aging effects of the resonator 500.

The BAW resonator 500 typically has an associated temperature-coefficient-of-frequency (TCF) that relates a change of resonant frequency to a change of operating temperature of the device. The inventors have discovered that the TCF of the BAW resonator 500 depends at least in part on the thickness of the dielectric film 555. Thus the dielectric film 555 may be referred to as the TCF dielectric film 555. The thickness of the TCF dielectric film 555 may be selected that results in a TCF characteristic, or curve, that results in improved frequency temperature stability at a desired operating temperature.

Figure 15:
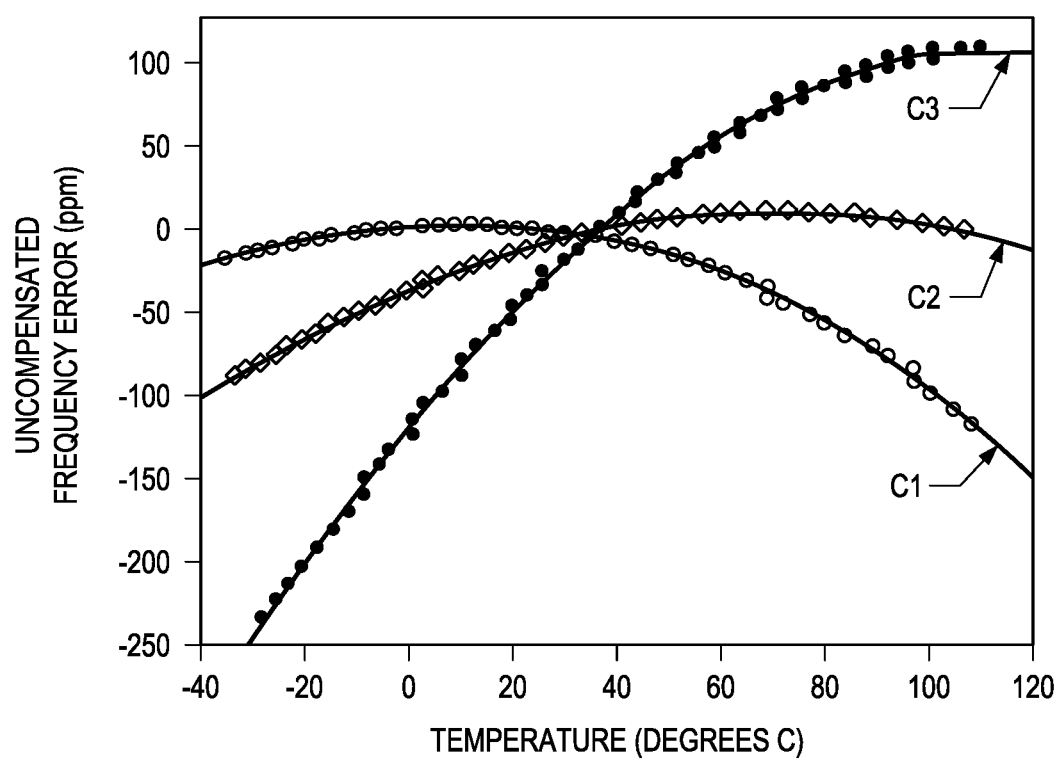
FIG. 15 illustrates example TCF curves corresponding to various thicknesses of temperature-coefficient-of-frequency (TCF) dielectric layer according to described examples.

For example, FIG. 15 illustrates three example TCF curves, C1, C2 and C3 determined for an example BAW device consistent with the BAW resonator 500. Each curve shows uncompensated frequency error in parts per million (ppm) as a function of temperature, and has a turn-over temperature at which the curve exhibits a local maximum, respectively at about 10° C., 75° C. and 110° C. Each curve C1, C2 and C3 corresponds to a different thickness of the TCF dielectric film 555, respectively 19 nm, 22 nm and 25 nm. The incremental change of frequency with respect to temperature, δf/δT, of the BAW resonator 500 is relatively small near each of the local maxima. Therefore if the operating temperature of the BAW resonator 500 is limited to a small range near the local maximum, a change of operating temperature within this range will be relatively small as compared to operating the same device far from the turn-over temperature. In some examples the turn-over temperature is set at a temperature that is outside a rated operating temperature range of the BAW resonator 500. In such examples a resistive heater such as the resistor 445 may be used to increase the temperature of the BAW resonator 500 above the ambient temperature, to a temperature near or at the turn-over temperature. e.g. within ±1° C. A resistive sensor may be used for closed-loop temperature control. At this relatively flat portion of the uncompensated frequency error curve, any inadvertent deviation of operating temperature from the turn-over temperature has a small effect on the resonant frequency of the BAW resonator 500.

Table 1 illustrates for each curve C1, C2 and C3 the frequency of the example BAW resonator 500 having a respective thickness of 19 nm, 22 nm and 25 nm for the TCF dielectric film 555. In each example the BAW resonator 500 is calibrated to zero ppm frequency error at an example operating temperature of 110° C. The total error in the observed temperature range is about 11 ppm for 19 nm, 3 ppm for 22 nm, and 0.3 ppm for 25 nm. These data show that for the example of the TCF dielectric film 555 composed substantially of silicon oxide, the turn-over temperature may be placed at a temperature high enough, e.g. 110° C., to be above a rated operating temperature of the BAW resonator 500, e.g. 100° C. Furthermore at this turn-over temperature the δf/δT value is the smallest of the three example curves. When controlled at a temperature of about 110° C., the resonant frequency of the BAW resonator 500 may be controlled within ±1 ppm of the design value. These results demonstrate that with careful selection of the TCF dielectric film 555 thickness, the BAW resonator 500 may operate with unparalleled frequency stability.

TABLE 1

| Temperature (° C.) | C1 (19 nm) Frequency Error (ppm) | C2 (22 nm) Frequency Error (ppm) | C3 (25 nm) Frequency Error (ppm) |
|---|---|---|---|
| 108 | 5.35 | 1.49 | −0.25 |
| 109 | 2.69 | 0.75 | −0.11 |
| 110 | 0.00 | 0.00 | 0.00 |
| 111 | −2.73 | −0.77 | 0.06 |
| 112 | −5.49 | −1.57 | 0.09 |

It is noted that the thickness of the TCF dielectric film 555 that results in a turn-over temperature greater than 100° C. may depend in part on the process used to produce the TCF dielectric film 555. For example, dielectrics formed by different processes may have different stress or density. It is within the ability of one skilled in the pertinent art to determine a thickness of the TCF dielectric film 555 formed in a locally available deposition tool that results in a desired turn-over temperature. Without implied limitation, the turn-over temperature may be in a range from about 100° C. to about 165° C., the lower temperature corresponding to some applications such as industrial automation or motor control, and the upper temperature corresponding to some applications such as internal combustion engine (ICE) or electric automotive motor control. For example, Automotive Grade 0 applications specify a maximum ambient temperature rating of 150° C. Other lesser and greater temperatures are within the scope of the disclosure. While not limited to any particular thickness, in some examples the TCF dielectric layer may have a thickness in a range between about 20 nm and about 35 nm for some industrially useful operating temperatures.

While there are no specific required conditions for forming the TCF dielectric film 555, it may be beneficial to use a process that deposits the dielectric material with a very slow deposition rate, e.g. in a range from about 5 nm/s to about 6 nm/s. This low rate may aid process control for very thin dielectric films. Specific process conditions are expected to differ for different process tools and material compositions, and may be determined by those skilled in the pertinent art without undue experimentation.

Modifications, additions, or omissions may be made to the systems, apparatuses, and methods described herein without departing from the scope of the disclosure. Moreover, the operations of the systems and apparatuses disclosed herein may be performed by more, fewer, or other components; and the methods described may include more, fewer, or other steps. Additionally, steps may be performed in any suitable order.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the disclosure.

What is claimed is:

1. An acoustic-wave device, comprising:
a first electrode located over a substrate;
a piezoelectric layer over the first electrode;
a second electrode over the piezoelectric layer and at least partially overlapping the first electrode; and
a temperature sensor in a same layer level as the first or second electrode.

2. The device of claim 1, wherein each of the temperature sensor and the second electrode includes at least one of molybdenum, platinum, or aluminum.

3. The device of claim 1, wherein the temperature sensor includes:
a resistive member having a first end and a second end and including multiple line segments between the first and second ends.

4. The device of claim 3, wherein the resistive member follows a serpentine path between the first and second ends.

5. The device of claim 3, wherein a group of line segments of the multiple line segments are parallel to a side of the second electrode and serve as resonate confiners during operation of the device.

6. The device of claim 5, wherein:
the first and second electrodes and the piezoelectric layer are configured to generate an acoustic wave having a wavelength, and each line segment of the group of line segments has a linewidth about equal to half the wavelength; and
a separation distance between nearest neighbor line segments of the group of line segments is about equal to half the wavelength.

7. The device of claim 1, further comprising a thermal coefficient of frequency (TCF) dielectric layer between the second electrode and the piezoelectric layer.

8. The device of claim 7, wherein the TCF dielectric layer has a thickness in a range between about 20 nm and about 35 nm.

9. The device of claim 1, wherein the temperature sensor is formed in the same layer as one of the first and second electrodes, and further comprising a heater in the same layer as the other of the first and second electrodes.

10. The device of claim 9, further comprising a controller configured to control the heater in response to a temperature-dependent property of the temperature sensor.

11. The device of claim 10, wherein the controller is configured to control the heater to maintain an elevated temperature of the piezoelectric layer in response to the temperature-dependent property.

12. The device of claim 11, wherein the elevated temperature is in a range between about 100° C. and about 165° C.

13. A method of forming a resonator, comprising:
forming a first electrode and a first resistor from a first metallic film over a substrate;
forming a piezoelectric film over the first electrode;
forming a second electrode over the first electrode from a second metallic film; and
forming a second resistor from the second metallic film,
configuring a controller to maintain an operating temperature of the piezoelectric film by directing current to a first one of the first and second resistors in response to a resistance of a second one of the first and second resistors, the operating temperature being greater than a specified maximum ambient temperature of the resonator.

14. The method as recited in claim 13, where a resonant frequency of the resonator varies by less than about #1 ppm while the piezoelectric film is maintained at the operating temperature.

15. The method as recited in claim 13, further comprising forming a dielectric layer having a thickness in arrange between about 20 nm and about 35 nm between the piezoelectric film and the second electrode.

16. The method as recited in claim 13, further comprising forming a silicon oxide layer having a thickness in arrange between about 20 nm and about 35 nm between the piezoelectric film and the second electrode.

17. The method as recited in claim 13, further comprising forming first and second power terminals of the first or the second resistor, wherein the first and second power terminals are immediate neighbors.

18. A resonator, comprising:
 a first electrode and a first resistor in a first metallic layer over a substrate;
 a piezoelectric film over the first electrode and the first resistor;
 a second electrode over the first electrode in a second metallic layer; and
 a second resistor from the second metallic layer,
 a controller configured to maintain an operating temperature of the piezoelectric film by directing current to a first one of the first and second resistors in response to a resistance of a second one of the first and second resistors, the operating temperature being greater than a specified maximum ambient temperature of the resonator.

19. The resonator as recited in claim 18, where a resonant frequency of the resonator varies by less than about +1 ppm while the piezoelectric film is maintained at the operating temperature.

20. The resonator as recited in claim 18, further comprising a dielectric layer having a thickness in arrange between about 20 nm and about 35 nm between the piezoelectric film and the second electrode.

21. The resonator as recited in claim 18, further comprising a silicon oxide layer having a thickness in arrange between about 20 nm and about 35 nm between the piezoelectric film and the second electrode.

22. The resonator as recited in claim 18, further comprising first and second power terminals of the first or the second resistor, wherein the first and second power terminals are immediate neighbors.

* * * * *